(12) United States Patent
Kato et al.

(10) Patent No.: US 9,608,190 B2
(45) Date of Patent: Mar. 28, 2017

(54) THERMOELECTRIC CONVERSION MATERIAL, METHOD FOR PRODUCING SAME, AND THERMOELECTRIC CONVERSION MODULE

(71) Applicants: LINTEC CORPORATION, Itabashi-ku (JP); KYUSHU INSTITUTE OF TECHNOLOGY, Kitakyushu-shi (JP)

(72) Inventors: Kunihisa Kato, Warabi (JP); Tsuyoshi Mutou, Saitama (JP); Koji Miyazaki, Kitakyushu (JP); Aiko Harada, Kitakyushu (JP)

(73) Assignees: LINTEC CORPORATION, Itabashi-ku (JP); KYUSHU INSTITUTE OF TECHNOLOGY, Kitakyushu-shi (JP)

( * ) Notice: Subject to any disclaimer, the term of this patent is extended or adjusted under 35 U.S.C. 154(b) by 0 days.

(21) Appl. No.: 14/770,573

(22) PCT Filed: Feb. 18, 2014

(86) PCT No.: PCT/JP2014/053823
§ 371 (c)(1),
(2) Date: Aug. 26, 2015

(87) PCT Pub. No.: WO2014/132844
PCT Pub. Date: Sep. 4, 2014

(65) Prior Publication Data
US 2016/0013391 A1    Jan. 14, 2016

(30) Foreign Application Priority Data

Feb. 27, 2013    (JP) .................................. 2013-037858

(51) Int. Cl.
*H01L 35/02*    (2006.01)
*H01L 35/14*    (2006.01)
(Continued)

(52) U.S. Cl.
CPC .............. *H01L 35/32* (2013.01); *H01L 35/14* (2013.01); *H01L 35/16* (2013.01); *H01L 35/18* (2013.01); *H01L 35/24* (2013.01); *H01L 35/34* (2013.01)

(58) Field of Classification Search
CPC ......... H01L 35/14; H01L 35/18; H01L 35/24; H01L 35/32; H01L 35/16
(Continued)

(56) References Cited

U.S. PATENT DOCUMENTS

2002/0158342 A1    10/2002    Tuominen et al.
2006/0266402 A1*   11/2006    Zhang ..................... H01L 35/30
                                                         136/205
(Continued)

FOREIGN PATENT DOCUMENTS

JP    2958451    10/1999
JP    2006 287000    10/2006
(Continued)

OTHER PUBLICATIONS

International Search Report Issued Apr. 1, 2014 in PCT/JP14/053823 Filed Feb. 18, 2014.
(Continued)

*Primary Examiner* — Lindsey Bernier
(74) *Attorney, Agent, or Firm* — Oblon, McClelland, Maier & Neustadt, L.L.P.

(57) ABSTRACT

The invention provides a thermoelectric conversion material having a low thermal conductivity and an improved figure of merit and a production method for the material, and also provides a thermoelectric conversion module. The thermo-
(Continued)

electric conversion material has, on a porous substrate having microscopic pores, a thermoelectric semiconductor layer formed of a thermoelectric semiconductor material, wherein the porous substrate has a polymer layer (B) on a plastic film (A) and the microscopic pores are formed in the polymer layer (B) and in a part of the plastic film (A). The production method for the thermoelectric conversion material comprises a substrate formation step of forming a porous substrate including a step 1, a step 2 and a step 3, and comprises a film formation step of forming a thermoelectric semiconductor layer through film formation of a thermoelectric semiconductor material on the porous substrate. The thermoelectric conversion module uses the thermoelectric conversion material.

10 Claims, 5 Drawing Sheets

(51) Int. Cl.
  *H01L 35/20* (2006.01)
  *H01L 35/32* (2006.01)
  *H01L 35/18* (2006.01)
  *H01L 35/16* (2006.01)
  *H01L 35/24* (2006.01)
  *H01L 35/34* (2006.01)

(58) Field of Classification Search
  USPC .......................................... 136/230, 239, 240
  See application file for complete search history.

(56) References Cited

U.S. PATENT DOCUMENTS

2011/0281085 A1* 11/2011 Tada ..................... G03F 7/0752
  428/195.1
2013/0019918 A1 1/2013 Boukai et al.

FOREIGN PATENT DOCUMENTS

| JP | 2007-59773 | 3/2007 |
| JP | 2011 105780 | 6/2011 |
| JP | 2012 174813 | 9/2012 |
| JP | 2013 89798 | 5/2013 |

OTHER PUBLICATIONS

Supplementary European Search Report as received in the corresponding European Patent Application No. 14756698.8-1555/2963694 dated Nov. 8, 2016.

Office Action as received in the corresponding Chinese Patent Application No. 201480010624.X dated Dec. 26, 2016.

Makoto Kashiwagi, et al., "Enhanced figure of merit of a porous thin film of bismuth antimony telluride", Applied Physics Letters 98, 023114 (2011), pp. 1-3.

* cited by examiner (a)

(b)

(a)

(b)

THERMOELECTRIC CONVERSION MATERIAL, METHOD FOR PRODUCING SAME, AND THERMOELECTRIC CONVERSION MODULE

TECHNICAL FIELD

The present invention relates to a thermoelectric conversion material that carries out energy interconversion between heat and electricity, and especially relates to a thermoelectric conversion material having a high figure of merit, and to its production method.

BACKGROUND ART

Recently, a thermoelectric power-generating technology for which the system is simple and can be down-sized has been specifically noted as a power recovery technology for unharnessed waste heat energy that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electrical conductivity comparable to that of metals and having a low thermal conductivity comparable to that of glass.

A thermoelectric conversion characteristic can be evaluated by a figure of merit Z ($Z=\sigma S^2/\lambda$). Here, S means a Seebeck coefficient, $\sigma$ means an electrical conductivity (reciprocal of resistivity), and $\lambda$ means a thermal conductivity. Increasing the value of the figure of merit Z improves the power generation efficiency, and for enhancing the efficiency in power generation, it is important to find out a thermoelectric conversion material having a large Seebeck coefficient S and a large electrical conductivity $\sigma$, and having a small thermal conductivity $\lambda$.

In general, the thermal conductivity $\lambda$ and the electrical conductivity $\sigma$ of a solid substance can be planned using the density of the material and the carrier concentration as parameters; however, the two physical properties are not independent of each other owing to the Wiedemann-Franz law but coordinate closely with each other, and therefore, in fact, it has heretofore been impossible to significantly improve the figure of merit.

Given the situation, PTL 1 proposes a thermoelectric conversion material that has been prepared by introducing a large number of supermicroscopic pores into the inside of a semiconductor material as dispersed therein at intervals equal to or smaller than the mean free path of electrons and phonons, so as to make the material porous to thereby reduce the thermal conductivity and increase the Seebeck coefficient thereof.

In PTL 2, there is given an investigation for forming a micro-cylinder structure by a method in which, on a coating film formed of a coating liquid that contains a general-purpose polymer such as polystyrene or the like and a hydrophobic organic solvent such as methylene chloride or the like, a nano- or micro-scale water vapor-containing gas, of which the dew point is controlled to be higher than the temperature of the coating film, is sprayed and condensed thereon, and the vaporization of water condensed in the hydrophobic organic solvent is stepwise repeated.

CITATION LIST

Patent Literature

PTL 1: Japanese Patent 2958451
PTL 2: JP-A 2011-105780

SUMMARY OF INVENTION

Technical Problem

However, according to Examples in PTL 1, the thermal conductivity reduced but the electrical conductivity also reduced (the resistivity greatly increased), and the non-dimensional figure of merit ZT (at T, absolute temperature, 300 K) merely increased from 0.017 to 0.156 through porous structure formation, and the situation is that the absolute value is far from practical realization.

In PTL 2, in addition, it is difficult to control the condition, and in particular, the distance between the pores is fluctuated, the proportion occupied by the pore area is small, and therefore the structure is not always suitable for a porous structure for use for a thermoelectric conversion material.

In consideration of the above-mentioned situation, an object of the present invention is to provide a thermoelectric conversion material having a low thermal conductivity and an improved figure of merit, to provide a production method for the material, and to provide a thermoelectric conversion module.

Solution to Problem

The present inventors have assiduously made repeated studies for solving the above-mentioned problems and, as a result, have found that, when a porous substrate with microscopic pores each having a high aspect ratio is used, then a thermoelectric conversion material having a significantly improved figure of merit can be obtained, and have completed the present invention.

Specifically, the present invention provides the following (1) to (10):
(1) A thermoelectric conversion material having, on a porous substrate having microscopic pores, a thermoelectric semiconductor layer formed of a thermoelectric semiconductor material, wherein the porous substrate has a polymer layer (B) on a plastic film (A) and the microscopic pores are formed in the polymer layer (B) and in a part of the plastic film (A).
(2) The thermoelectric conversion material according to the above (1), wherein the ratio of the depth (H1) to the mean diameter (D1), (H1/D1) of the microscopic pores is from 0.5 to 20.
(3) The thermoelectric conversion material according to the above (1), wherein the thickness of the thermoelectric semiconductor layer is from 50 nm to 20 μm.
(4) The thermoelectric conversion material according to the above (1), wherein the polymer layer (B) is formed of a polymer that comprises a polyhedral oligomeric silsesquioxane-containing polymethacrylate.
(5) The thermoelectric conversion material according to the above (4), wherein the thickness of the polymer layer (B) is from 1 to 100 nm.

(6) The thermoelectric conversion material according to the above (1), wherein the plastic film (A) is formed of a polyimide, a polyethylene terephthalate or a polycarbonate.
(7) The thermoelectric conversion material according to the above (6), wherein the thickness of the plastic film (A) is from 1 to 100 μm.
(8) The thermoelectric conversion material according to the above (1), wherein the thermoelectric semiconductor material is at least one of a bismuth-tellurium-based thermoelectric semiconductor material and a silicide-based thermoelectric semiconductor material.
(9) A thermoelectric conversion module using the thermoelectric conversion material according to any one of the above (1) to (8).
(10) A method for producing a thermoelectric conversion material having a thermoelectric semiconductor layer formed on a porous substrate, which comprises:
a substrate formation step of forming a porous substrate, including a step of forming a block copolymer layer of a block copolymer on a plastic film (A) (step 1), a step of processing the block polymer layer for micro-phase separation (step 2), and a step of selectively entirely removing one polymer phase of the micro-phase separated block polymer layer through etching, and removing a part of the plastic film (A) through etching using the remaining polymer phase as a mask to thereby form microscopic pores each formed of the polymer layer (B) and a part of the plastic film (A) (step 3), and a film formation step of forming a thermoelectric semiconductor layer through film formation of a thermoelectric semiconductor material on the porous substrate.

Advantageous Effects of Invention

According to the present invention, by using a porous substrate with microscopic pores each having a high aspect ratio, there can be obtained a thermoelectric conversion material having an improved figure of merit, and the present invention can realize high conversion efficiency.

DESCRIPTION OF EMBODIMENTS

Thermoelectric Conversion Material

The thermoelectric conversion material of the present invention is a thermoelectric conversion material having, on a porous substrate having microscopic pores, a thermoelectric semiconductor layer formed of a thermoelectric semiconductor material, wherein the porous substrate has a polymer layer (B) on a plastic film (A) and the microscopic pores are formed in the polymer layer (B) and in a part of the plastic film (A).

Figure 1:
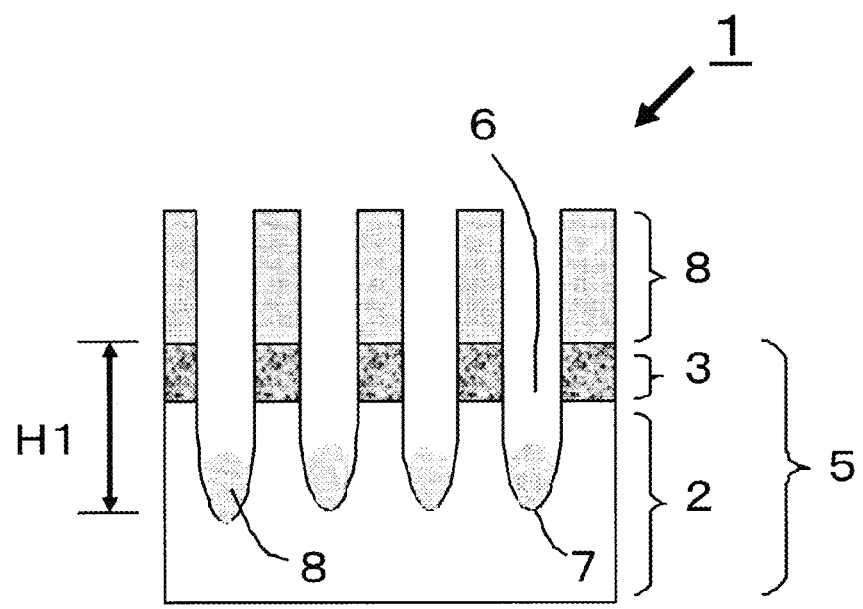
FIG. 1 This is a cross-sectional view showing one example of the thermoelectric conversion material of the present invention.

FIG. 1 shows one example of a cross-sectional view of the thermoelectric conversion material of the present invention. 1 indicates a thermoelectric conversion material, 2 indicates a plastic film (A), 3 indicates a polymer layer (B), 5 indicates a porous substrate, 6 indicates a microscopic pore, 7 indicates an inner bottom, and 8 indicates a thermoelectric semiconductor layer.
(Porous Substrate)
The porous substrate 5 having microscopic pores for use in the present invention has a polymer layer (B) 3 on a plastic film (A) 2, in which the microscopic pores 6 are formed in the polymer layer (B) 3 and in a part of the plastic film (A) 2. The porous substrate 5 has microscopic pores 6 having a high aspect ratio, which are formed in the polymer layer (B) 3 and in a part of the plastic film (A) 2, and therefore the thermal conductivity thereof is sufficiently low.

Not specifically defined, the plastic film (A) may be any one not having any influence on the electric conductivity and the thermal conductivity of the thermoelectric conversion material and capable of being removed through etching with oxygen plasma or the like, and includes, for example, a polyimide, a polyethylene terephthalate or a polycarbonate. Of those, especially preferred is a polyimide from the viewpoint of the heat resistance thereof.

The thickness of the plastic film (A) is preferably from 0.5 to 100 μm, more preferably from 1 to 50 μm. The range is preferred as capable of securing the mechanical strength of the porous substrate and capable of providing microscopic pores 6 having a high aspect ratio.

The polymer layer (B) is not specifically defined. However, in a case where the thermoelectric conversion material is produced according to the method of etching a block copolymer and forming the remaining polymer phase into the polymer layer (B), as mentioned below, it is desirable that the layer is formed of a polymer having high etching resistance from the viewpoint of forming microscopic pores having a high aspect ratio. The polymer of the type includes, for example, polyhedral oligomeric silsesquioxane-containing polymethacrylate (PMAPOSS), polystyrene, polypropylene oxide, poly-α-methylstyrene, polymethacrylate, polybutadiene, polyisoprene, polysiloxane such as polydimethylsiloxane, polysilsesquioxane, fluorine-containing polymer, etc. The polysilsesquioxane includes, for example, polyhedral oligomeric silsesquioxane-containing polymethacrylate (PMAPOSS), polymethylsilsesquioxane, polymethyl-hydrosilsesquioxane, polyphenylsilsesquioxane, polyphenyl-methylsilsesquioxane, polyphenyl-polypropylsilsesquioxane, polyphenyl-vinylsilsesquioxane, polycyclohexylsilsesquioxane, polycyclopentylsilsesquioxane, poly(2-chloroethyl)silsesquioxane, etc. Of those, it is desirable that the polymer layer (B) is formed of a polymer that comprises a polyhedral oligomeric silsesquioxane-containing polymethacrylate.

The thickness of the polymer layer (B) is preferably from 1 to 100 nm, more preferably from 3 to 50 nm. The range is preferred as capable of providing microscopic pores having a high aspect ratio and consequently capable of improving the figure of merit of the material.

The mean diameter (D1) of the microscopic pores 6 in the porous substrate 5 is preferably 50 nm to 30 μm, more preferably from 100 nm to 10 μm. The mean diameter of 50 nm or more is preferred because of the reason that, for example, even after film formation with a thermoelectric semiconductor layer through vapor deposition or the like thereon, the microscopic pores 6 would not be clogged by the thermoelectric semiconductor layer and therefore the microscopic pores could be kept as such. The mean diameter of 30 μm or less is preferred as capable of securing the mechanical strength of the porous substrate and capable of expecting sufficient reduction in the thermal conductivity of the substrate. The mean diameter of the microscopic pores 6 may be determined, for example, through SEM observation of the surface of the porous substrate 5. Concretely, on a SEM photograph of the substrate, the maximum diameter and the minimum diameter of each microscopic pore 6 existing in the viewing field are read, the data are averaged to give a mean value, and then, the resultant mean value is processed according to a simple average method for all the analyzed pores to give the mean diameter.

The depth (H1) of the microscopic pores 6 is preferably from 50 nm to 40 μm, more preferably from 100 nm to 20 μm. The depth (H1) of 50 nm or more is preferred as capable of expecting sufficient reduction in the thermal conductivity of the material. The depth of 40 μm or less is preferred as capable of realizing sufficient expression of the Seebeck coefficient from the viewpoint that the Seebeck coefficient of the deposited layer of the thermoelectric conversion material depends on the thickness of the layer. In the present invention, the depth (H1) of the microscopic pore 6 is a value from the top of the porous substrate 5 (that is, the top of the polymer layer (B)) to the inner bottom 7 of the microscopic pore 6, as shown in FIG. 1.

Also preferably, the aspect ratio of the microscopic pore 6, or that is, the ratio of the depth (H1) to the mean diameter (D1) thereof, (H1/D1) is from 0.5 to 20, more preferably from 1 to 15, even more preferably from 2 to 10. The aspect ratio falling within the range is preferred as capable of sufficiently reducing the thermal conductivity of the material.

Further, it is desirable that the microscopic pores 6 are distributed while spaced from each other by a suitable distance therebetween, and the adjacent microscopic pores are not physically connected with each other. The mean distance via which the microscopic pores 6 are aligned (the center-to-center distance between the adjacent pores) is preferably from 15 to 1500 nm, more preferably from 15 to 300 nm, even more preferably from 30 to 150 nm. The mean distance of 15 nm or more is preferred as being longer than the electron mean free path, and therefore the distance within the range could hardly be an electron scattering factor so that the material can favorably maintain the electric conductivity thereof. The mean distance of 1500 nm or less is preferred as being shorter than the phonon mean free path, and therefore the distance within the range could readily be a phonon scattering factor so that the thermal conductivity of the material can be thereby reduced. In a case where the mean distance is from 30 to 150 nm, the number of the microscopic pores would be from $0.44 \times 10^8$ to $11.1 \times 10^8$ or so per mm$^2$.

Not specifically defined, the shape of the bottom of the microscopic pores 6 may be flat, curved or roughened.

(Thermoelectric Semiconductor Layer)

The thermoelectric semiconductor layer 8 for use in the thermoelectric conversion material of the present invention is a layer provided by forming a thermoelectric semiconductor material into a film, and is formed on the porous substrate 5. In the present invention, the thermoelectric semiconductor material is not specifically defined and may be any material having the ability to convert thermal energy given by temperature difference into electric energy. For example, usable here are a bismuth-tellurium-based thermoelectric semiconductor material such as a p-type bismuth telluride, an n-type bismuth telluride, $Bi_2Te_3$, etc.; a telluride-based thermoelectric semiconductor material such as GeTe, PbTe, etc.; an antimony-tellurium-based thermoelectric semiconductor material; a zinc-antimony-based thermoelectric semiconductor material such as ZnSb, $Zn_3Sb_2$, $Zn_4Sb_3$, etc.; a silicon-germanium-based thermoelectric semiconductor material such as SiGe, etc.; a bismuth-selenide-based thermoelectric semiconductor material such as $Bi_2Se_3$, etc., a silicide-based thermoelectric semiconductor material such as $\beta$-$FeSi_2$, $CrSi_2$, $MnSi_{1.73}$, $Mg_2Si$, etc.; an oxide-based thermoelectric semiconductor material; a Heusler material such as FeVAl, FeVAlSi, FeVTiAl, etc. Of those, preferred are a bismuth-tellurium-based thermoelectric semiconductor material such as a p-type bismuth telluride, an n-type bismuth telluride, $Bi_2Te_3$, etc., and a silicide-based thermoelectric semiconductor material such as $\beta$-$FeSi_2$, $CrSi_2$, $MnSi_{1.73}$, $Mg_2Si$, etc.

Of the p-type bismuth telluride, the carrier is a hole and the Seebeck coefficient thereof is a positive value, and the p-type bismuth telluride preferably has a structure of $Bi_XTe_3Sb_{2-X}$ ($0<X\leq0.6$). Of the n-type bismuth telluride, the carrier is an electron and the Seebeck coefficient thereof is a negative value. The n-type bismuth telluride preferably has a structure of $Bi_2Te_{3-Y}Se_Y$ ($0<Y\leq3$).

One alone of the p-type bismuth telluride or the n-type bismuth telluride may be used in the present invention, but preferably these are used as a pair of them. For example, plural pairs of them may be used as connected to each other via an electrode, and can be used as a thermoelectric conversion material for power generation or for cooling.

The method for forming a film of the thermoelectric semiconductor material is not specifically defined. For example, the above-mentioned thermoelectric semiconductor material may be formed into a film according to a known method such as an arc plasma vapor deposition method, a flash vapor-deposition method or the like to form the thermoelectric semiconductor layer 8, thereby providing the thermoelectric conversion material of the present invention.

The thermoelectric semiconductor layer 8 may be formed through film formation of the thermoelectric semiconductor material on the porous substrate 5. The thermoelectric semiconductor layer 8 may be formed on only the top of the porous substrate 5 (that is, only on the top of the polymer layer (B) 3), or may be formed both on the polymer layer (B) and on the inner bottom 7 of each microscopic pore 6. In the latter case, the thermoelectric semiconductor layer 8 on the polymer layer (B) 3 is kept electrically insulated from the thermoelectric semiconductor layer 8 existing on the inside bottom 7 of each microscopic pore 6.

Preferably, the thickness of the thermoelectric semiconductor layer 8 is from 50 nm to 20 μm, more preferably from 100 nm to 15 μm, even more preferably from 300 nm to 10 μm.

In the case where the thermoelectric semiconductor layer 8 is formed on the inner bottom 7 of each microscopic pore 6, the thickness of the thermoelectric semiconductor layer on the inner bottom 7 is preferably from 25 nm to 1.5 μm, more preferably from 50 nm to 1.0 μm. The thickness of the thermoelectric semiconductor layer 8 on the inner bottom 7 that falls within the above-mentioned range is preferred as capable of securing the electric insulation thereof from the thermoelectric semiconductor layer 8 formed on the top of the porous substrate 5.

[Thermoelectric Conversion Module]

The thermoelectric conversion module of the present invention uses a p-type thermoelectric element and an n-type thermoelectric element comprising the thermoelectric conversion material of the present invention, in which, for example, electrodes are so arranged that the p-type thermoelectric element and the n-type thermoelectric element are connected to each other in series. In a case where the thermoelectric conversion module is used as a device for power generation, one side of the thermoelectric conversion module is set on a high-temperature side while the other side thereof is set on a low-temperature side. On the other hand, in a case where the module is used as a cooling or heating device, a voltage is applied to both terminals of the thermoelectric conversion module so that one side of the module can serve as a high-temperature side and the other side thereof can serve as a low-temperature side.

Figure 7:
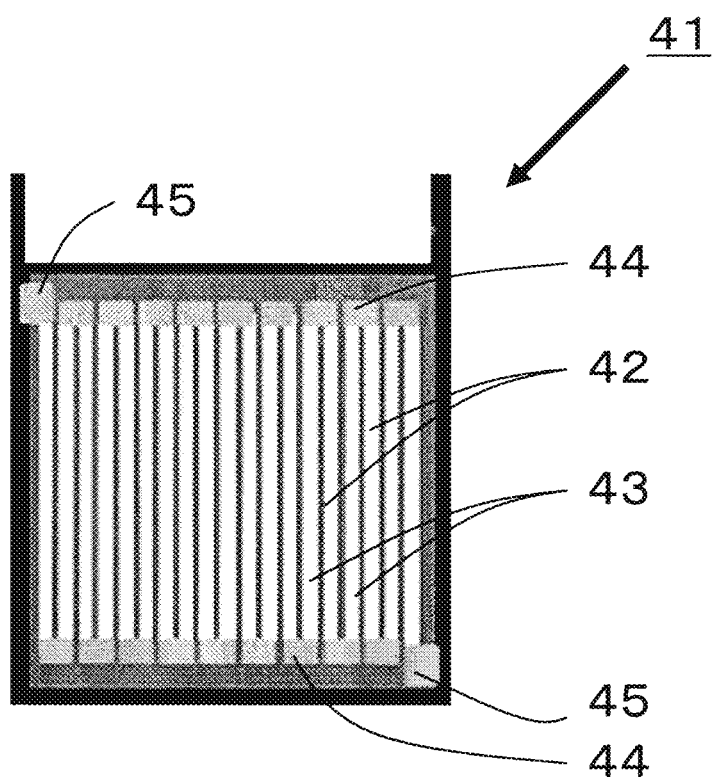
FIG. 7 This is a plan view showing one example of a thermoelectric conversion module using the thermoelectric conversion material of the present invention.

FIG. 7 shows one example of a plan view of a thermoelectric conversion module using the thermoelectric conversion material of the present invention. The thermoelectric conversion module 41 comprises, for example, plural pairs of a thermoelectric semiconductor layer 42 formed of a p-type bismuth telluride and a thermoelectric semiconductor layer 43 formed of an n-type bismuth telluride, in which those pairs are electrically connected in series with each other via the bonding electrode 44 of copper or the like and in which a temperature difference is given between the bonding part and the branch part, and the generated thermoelectromotive force is taken out via the thermoelectromotive force-taking out electrode 45 and is used as a power source.

[Production Method for Thermoelectric Conversion Material]

The production method for a thermoelectric conversion material of the present invention is a method for producing a thermoelectric conversion material having a thermoelectric semiconductor layer formed on a porous substrate, and comprises a substrate formation step of forming a porous substrate, including a step of forming a block copolymer layer of a block copolymer on a plastic film (A) (step 1), a step of processing the block polymer layer for micro-phase separation (step 2), and a step of selectively entirely removing one polymer phase of the micro-phase separated block polymer layer through etching, and removing a part of the plastic film (A) through etching using the remaining polymer phase as a mask to thereby form microscopic pores each formed of the polymer layer (B) and a part of the plastic film (A) (step 3), and a film formation step of forming a thermoelectric semiconductor layer through film formation of a thermoelectric semiconductor material on the porous substrate.

Figure 2:
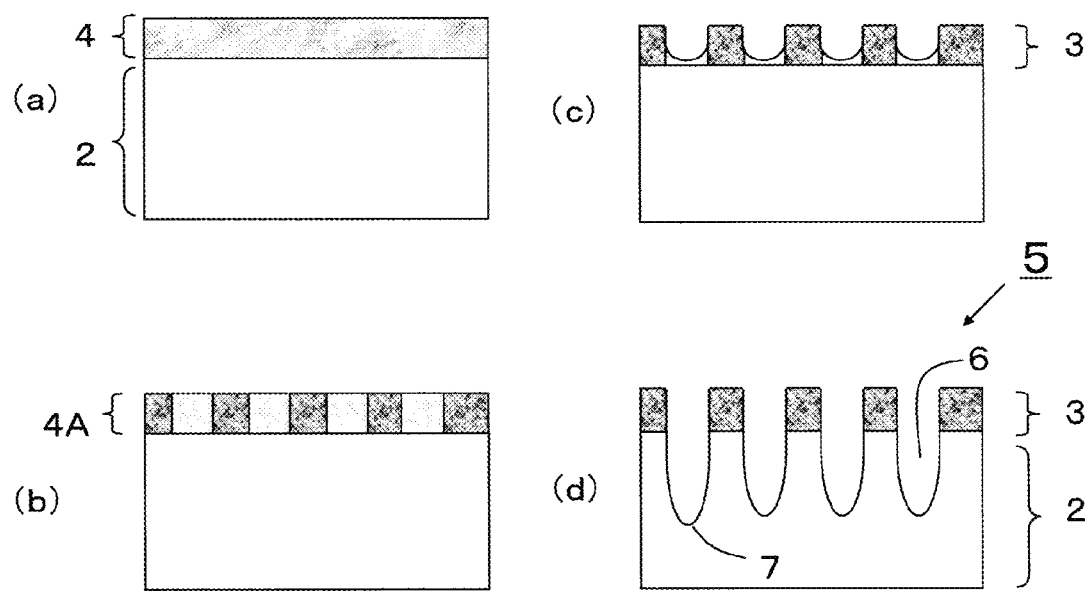
FIG. 2 This shows a production step for a porous substrate for the present invention and a cross-sectional view of the porous substrate, in which (a) is a cross-sectional view for explaining the step 1, (b) is a cross-sectional view for explaining the step 2, and (c) and (d) each are a cross-sectional view for explaining the step 3 and the porous substrate.

FIG. 2 schematically shows one example of a production step for the porous substrate for the present invention and a cross-sectional view of the porous substrate, in which (a) is a cross section after formation of a block copolymer layer 4 on a plastic film (A) 2, (b) is a cross section of a micro-phase separated block copolymer layer 4A, (c) is a cross section after selective removal of one polymer phase from the micro-phase separated block copolymer layer 4A through etching, followed by formation of a polymer layer 3 on the plastic film, and (d) is a cross section of the resultant porous substrate 5.

(1) Substrate Formation Step (1)-1 Step 1

The step 1 is a step of forming the above-mentioned block copolymer layer 4 of a block copolymer on the plastic film (A) 2, as shown in FIG. 2(a).

According to the production method for a porous substrate of the present invention, a cylinder structure aligned in the vertical direction to the surface of the plastic film (A) is employed as the micro-phase separated structure of a block copolymer layer, by which, therefore, microscopic pores can be formed efficiently in a part of the plastic film (A). Concretely, owing to the etching rate difference between the phase-separated phases, one polymer phase is selectively etched and a part of the plastic film (A) is thereby etched using the remaining polymer phase that serves as a mask, and consequently, microscopic pores can be efficiently formed in a part of the plastic film (A).

Not specifically defined, the block copolymer may be any one where the etching rate difference between the polymer phases is so great as to be able to form a cylinder-structured micro-phase separated structure. The method for producing the block copolymer is not specifically defined, for which employable is any known method.

The block copolymer comprises a polymer unit A which forms a polymer phase remaining by etching in the step 3 to be mentioned below and a polymer unit B of which the etching rate is larger than that of the polymer unit A and which is selectively completely removed in the step 3 to be mentioned below.

As the polymer to constitute the polymer unit A, there are exemplified those herein referred to as the polymer to form the above-mentioned polymer layer (B).

The polymer to constitute the polymer unit B may be any one, which, not specifically defined, has an etching rate larger than that of the polymer unit A and which, in the step 3 to be mentioned below, can be selectively completely removed, and includes, for example, polyethylene oxide, poly(hydroxyethyl methacrylate), polyacrylic acid, polymethacrylic acid, polyacrylate, polymethacrylate, polyvinyl alcohol, poly(hydroxystyrene), etc.

Concretely, the block copolymer includes a block copolymer comprising a polymethyl methacrylate (PMMA) unit and a polyhedral oligomeric silsesquioxane-containing polymethacrylate (PMAPOSS) unit, a block copolymer comprising a polymethyl methacrylate (PMMA) unit and a polyethylene oxide unit, a block copolymer comprising a polystyrene (PS) unit and a polyethylene oxide (PEO) unit, etc.

Of those, preferred is a block copolymer that comprises a polymethyl methacrylate (PMMA) unit and a polyhedral oligomeric silsesquioxane-containing polymethacrylate (PMAPOSS) unit.

A block copolymer solution prepared by dissolving the above-mentioned block copolymer in an organic solvent is applied onto the plastic film (A) 2, and dried to form the block copolymer layer 4 thereon. The organic solvent to be used includes, for example, cyclopentanone, toluene, chloroform, THF, benzene, cyclohexanone, etc. Especially preferred is cyclopentanone.

As the method for forming the block copolymer layer 4, for example, there are mentioned spin coating, roll coating, dip coating, die coating, gravure coating and the like, to which, however, the present invention is not specifically defined. Also not specifically defined, the concentration of the block copolymer in the block copolymer solution is preferably from 0.1 to 20% by mass, more preferably from 0.5 to 10% by mass.

(1)-2 Step 2

The step 2 is a step of processing the block polymer layer 4 that has been formed in the above, for micro-phase separation, as shown in FIG. 2(*b*). Concretely, in the step 2, the block copolymer layer 4 formed in the above is exposed to a solvent vapor atmosphere and kept as such for a predetermined period of time (hereinafter this may be referred to as solvent annealing) to thereby provide the micro-phase separated block copolymer layer 4A.

The solvent to be used for the solvent annealing may be any solvent that has a high affinity for any one of the two polymer components constituting the polymers of the block copolymer, and, for example, includes carbon disulfide, acetone, toluene, etc. Above all, more preferred is carbon disulfide from the viewpoint of the ability thereof to provide a micro-phase separated structure having a short domain distance.

Domain distance control in the micro-phase separated structure is possible by varying the molecular weight of the two polymers constituting the block copolymer for every unit.

(1)-3 Step 3

The step 3 is a step of selectively entirely removing one polymer phase of the micro-phase separated block polymer layer 4A through etching, as shown in FIG. 2(*c*), and removing a part of the plastic film (A) 2 through etching using the remaining polymer phase as a mask to thereby form microscopic pores 6 each formed of the polymer layer (B) 3 and a part of the plastic film (A) 2, as shown in FIG. 2(*d*).

In the step 3, the polymer phase, which has low etching resistance, or that is, which has a high etching rate, is selectively etched away through the etching treatment and the polymer phase which has high etching resistance, or that is, which has a low etching rate remains on the plastic film (A).

Next, the plastic film (A) is etched using the remaining polymer phase as a mask, and the plastic film (A) is thereby removed. Accordingly, there are formed microscopic pores 6 each formed in the remaining polymer phase and in a part of the plastic film (A)

For example, in a case where a block copolymer comprising a polymethyl methacrylate (PMMA) unit and a polyhedral oligomeric silsesquioxane-containing polymethacrylate (PMAPOSS) unit is used as the block copolymer layer 4, the PMAPOSS phase has higher etching resistance, for example, to oxygen plasma as compared with the PMMA phase in the micro-phase separated polymer layer, and the etching rate ratio of the PMAPOSS phase is different from that of the PMMA phase by 10 times or so. Accordingly, through oxygen plasma treatment, the PMMA phase which has low etching resistance, or that is, which has a high etching rate is selectively etched away, and the PMAPOSS phase remains on the plastic film. Next, after the PMMA phase is removed, the plastic film (A) is etched using the PMAPOSS phase as a mask. Accordingly, the plastic film (A) is removed, and the microscopic pores 6 are formed. The PMAPOSS phase remains on the plastic film (A), and therefore, the microscopic pores 6 are to be formed of the PMAPOSS phase (polymer layer) and a part of the plastic film (A). Preferably, the plastic film (A) is etched continuously after removal of the PMMA phase, from the viewpoint of the stability of the microscopic pores and from the viewpoint of continuously using the production apparatus and therefore reducing the number of the processing steps.

The method of etching the block copolymer layer 4 and the plastic film (A) is not specifically defined. From the viewpoint of the easiness in controlling the depth and the mean diameter of the microscopic pores, preferred is oxygen plasma treatment. Oxygen plasma treatment is a treatment in which, for example, using an RIE (reactive ion etching) apparatus, oxygen gas is introduced into the apparatus at a predetermined flow rate in vacuum to convert it into plasma and the intended organic substance is thereby removed through chemical change into water and carbon dioxide. The oxygen plasma treatment condition including the oxygen gas flow rate, the treatment time and others may be suitably controlled in consideration of the thickness of the block copolymer layer 4, the material of the plastic film (A) and the etching amount (depth).

(2) Film Formation Step

The film formation step is a step of forming, after the above-mentioned substrate formation step, a thermoelectric semiconductor layer on the resultant porous substrate 5 through film formation with a thermoelectric semiconductor material. Here, the film formation method is not specifically defined, for which an arc plasma vapor-deposition method or a flash vapor-deposition method may be employed. Especially preferred is an arc plasma vapor-deposition method from the viewpoint that the compositional ratio of the substance to be deposited can be maintained accurately in film formation and the thermal damage to the plastic film (A) is small.

(Film Formation According to Arc Plasma Vapor-Deposition Method)

The arc plasma vapor-deposition method is a film formation method in which a starting material as a vapor source is instantaneously ionized into plasma through pulsed arc discharge and the resultant vapor particles are deposited on a substrate, as described in detail hereinunder.

According to the arc plasma vapor-deposition method, a thermoelectric semiconductor material can be instantaneously converted into plasma, and the ionized vapor particles are deposited on a porous substrate and, in addition, the starting material scatters little and the unvaporized residue remains little, and consequently, as compared with a flash vapor-deposition method that has heretofore been employed in the art, the composition accuracy in the formed film is good and changes little from the composition of the starting material, or that is, a uniform thin film can be formed and the Seebeck coefficient and the electrical conductivity of the film can be prevented from lowering.

In addition, another advantage of the arc plasma vapor-deposition method is that the method does not use argon gas or the like for plasma generation and in the method, the substrate temperature rises little, and consequently, the method is favorable for the film formation method for the plastic film in the present invention. Furthermore, in the arc plasma vapor-deposition method, the straightness of the material during vapor deposition is kept within a predetermined range, and especially in the case of film formation on a porous substrate as in the present invention, vapor deposition hardly occurs on the wall surface in microscopic pores and therefore the thermoelectric performance of the resultant material hardly lowers, as compared with any other vapor deposition method.

Figure 3:
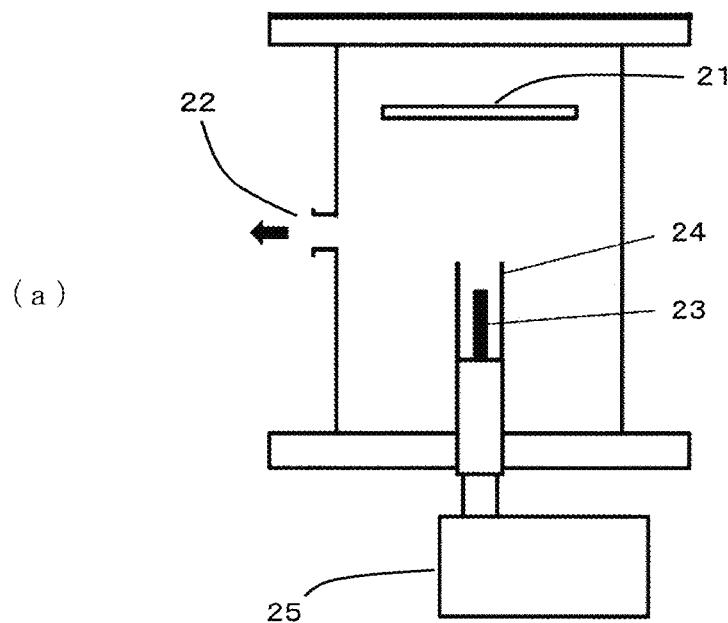
FIG. 3 This shows one example of a coaxial vacuum arc plasma vapor-deposition apparatus used in Examples of the present invention, in which (a) is a schematic view of the vapor deposition apparatus, and (b) is a conceptual view for explaining the movement of the arc plasma vapor-deposition source.
Figure 3:
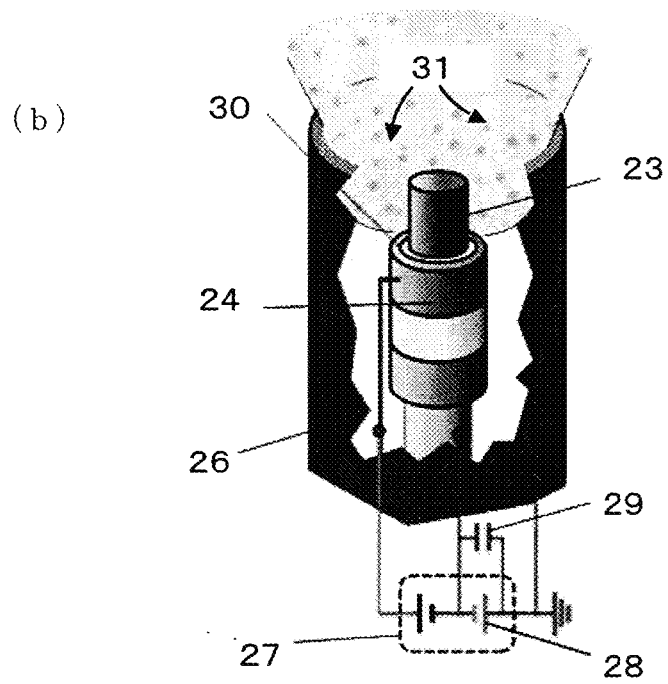

An arc plasma vapor-deposition apparatus is described concretely. FIG. 3 is one example of a coaxial vacuum arc plasma vapor-deposition apparatus used in Examples of the present invention, in which (a) is a schematic view of the vapor deposition apparatus, and (b) is a conceptual view for explaining the movement of the arc plasma vapor-deposition source.

In FIGS. 3(a) and (b), 21 is a porous substrate, 22 is a vacuum exhaust port, 23 is a cathode electrode (vapor-deposition source: target), 24 is a trigger electrode, 25 is a power-supply unit, 26 is an anode electrode, 27 is a trigger power source, 28 is an arc power source, 29 is a capacitor, 30 is an insulator, and 31 is an arc plasma.

The coaxial vacuum arc plasma vapor-deposition source in the arc plasma vapor-deposition apparatus is so designed, as shown in FIG. 3(b), that the cylindrical trigger electrode 24 and the columnar cathode electrode 23 of a vapor-deposition source, of which the tip section is formed of a starting material of a thermoelectric semiconductor material, are arranged to be adjacent to each other via the disc insulator 30, and the cylindrical anode electrode 26 is coaxially arranged around the cathode electrode 23 and the trigger electrode 24.

The cathode electrode 23 is a columnar one produced by shaping the above-mentioned thermoelectric semiconductor material, according to a known method such as a hot-pressing method or the like.

In actual vapor deposition, the coaxial vacuum arc plasma vapor-deposition apparatus equipped with the above-mentioned coaxial vacuum arc plasma vapor-deposition source is used, in which pulsed arc discharge is generated between the trigger electrode 24 and the anode electrode 26 so that the thermoelectric semiconductor material is instantaneously converted into plasma, while the arc plasma 31 is intermittently induced between the cathode electrode 23 and the anode electrode 26 to thereby deposit the ionized vapor particles on the porous substrate 5 arranged just above the arc plasma 31 for film formation on the substrate. The porous substrate 5 may be heated or may not be heated.

In the present invention, the arc voltage to generate the arc plasma 31, the capacitance of the capacitor 29 for discharge and the frequency of the arc plasma 31 may be controlled to provide vapor particles having a uniform particle size, whereby a thermoelectric thin film having good adhesiveness to the porous substrate can be produced.

The arc voltage to generate the arc plasma 31 is generally from 50 to 400 V, preferably from 70 to 100 V, and the capacitance of the capacitor 29 for discharge is generally from 360 to 8800 µF, preferably from 360 to 1080 µF. The frequency of the arc plasma 21 is generally from 50 to 50000 times.

Further, by suitably controlling the distance between the porous substrate 5 and the arc plasma 31, the vapor-deposition range may be controlled. For example, in Examples to be given hereinunder, the distance between the cathode electrode (vapor-deposition source: target) and the porous substrate is 150 mm. The degree of vacuum inside the chamber is preferably $10^{-2}$ Pa or less.

In the present invention, after the film formation of the thermoelectric semiconductor material, the formed thermoelectric semiconductor layer is preferably annealed for crystal growth and stabilization of the layer. Not specifically defined, the annealing method may be any known method. The annealing condition is not also specifically defined, falling within a range not having any negative influence on the thermoelectric semiconductor layer and the plastic film. For example, in a case where the thermoelectric semiconductor layer is formed of a p-type thermoelectric semiconductor material and the plastic film is formed of a polyimide resin, preferably, the annealing temperature is from 100 to 300° C. and the treatment time is from 0.1 to 48 hours.

EXAMPLES

The present invention is described in more detail with reference to the following Examples; however, the present invention is not whatsoever limited by these Examples.

The thermoelectric performance of the thermoelectric conversion materials produced in Examples and Comparative Examples was evaluated by calculating the thermal conductivity, the Seebeck coefficient and the electrical conductivity thereof according to the methods mentioned below. Further, thermoelectric conversion modules were constructed and the output characteristics thereof were evaluated.

(a) Thermal Conductivity

The thermal conductivity was calculated according to 3ω method. A thin metal wire (2 mm×20 µm in width), an alternate current application electrode, and a 3ω signal detection electrode were arranged on the surface of the thermoelectric semiconductor layer side of the thermoelectric conversion material produced in Examples and Comparative Examples. Next, using a function generator, an alternate current was applied to the alternate current application electrode to thereby periodically heat the thin metal wire. The temperature of the heated thin metal wire was measured from the signal output power from the 3ω signal detection electrode, and the heating amount and the temperature response of the heated thermoelectric conversion material were analyzed. The found data were compared with the data of the porous substrate alone not having a thermoelectric semiconductor layer, and the heat resistance of the thermoelectric semiconductor layer was measured. From the results and the thickness of the thermoelectric semiconductor layer, the thermal conductivity of the thermoelectric conversion material was calculated.

(b) Seebeck Coefficient

According to JIS C 2527:1994, the thermoelectromotive force of the thermoelectric conversion material produced in Examples and Comparative Examples was measured, and the Seebeck coefficient was calculated. One end of the sample produced in Examples and Comparative Examples was heated, and the resulting temperature difference between both ends of the thermoelectric conversion material was measured using a chromel-alumel thermocouple, and from the electrode adjacent to the thermocouple installation position, the thermoelectromotive force was measured. Concretely, the distance between both ends of the thermoelectric conversion material of which the temperature difference and the electromotive force are to be measured was to be 25 mm, one end was kept at 20° C., and the other end was heated from 25° C. to 50° C. at intervals of 1° C., whereupon the thermoelectromotive force was measured and the Seebeck coefficient was calculated from the inclination. The thermocouple installation position and the electrode installation position are symmetric to each other relative to the centerline of the thin film, and the distance between the thermocouple and the electrode is 1 mm.

(c) Electrical Conductivity

Using a surface resistivity meter (Mitsubishi Chemical's trade name: Loresta GP MCP-T600) and according to a four-terminal method, the surface resistivity of the thermoelectric conversion material produced in Examples and Comparative Examples was measured, and the electrical conductivity thereof was calculated.

(d) Non-Dimensional Figure of Merit

From the resultant values of the Seebeck coefficient, the electrical conductivity and the thermal conductivity, the figure of merit Z ($Z=\sigma \times S^2/\lambda$) was obtained, and the Non-dimensional figure of merit Z×T at T=300 K was calculated.

Example 1

(1) Formation of Porous Substrate

A porous substrate was formed according to a formation step for a block copolymer layer (step 1), a micro-phase separation step under solvent vapor (step 2) and subsequently a formation step for microscopic pores through oxygen plasma treatment (step 3), as described below.

Figure 4:
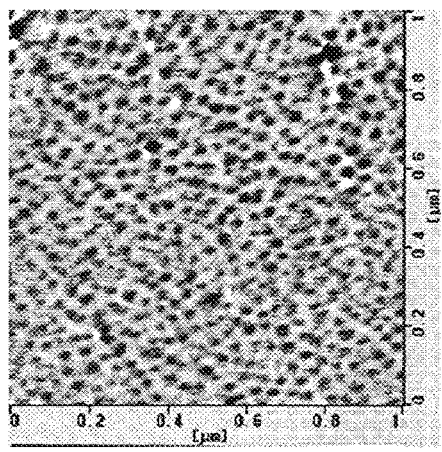
FIG. 4 This is an AFM photograph (measurement range, 1000 nm×1000 nm) after micro-phase separation of the block copolymer layer obtained in Example 1 of the present invention.

A block copolymer comprising a polymethyl methacrylate (PMMA) unit and a polyhedral oligomeric silsesquioxane-containing polymethacrylate (PMAPOSS) unit (PMMA-b-PMAPOSS, in which the molecular weight of the PMMA unit is 13000, and the molecular weight of the PMAPOSS unit is 42000) was dissolved in cyclopentanone (manufactured by Tokyo Chemical Industry Co., Ltd.) to prepare a block copolymer solution having a solution concentration of 0.5 wt %. Using the prepared polymer solution and according to a spin coating method, the solution was applied onto a polyimide resin substrate (thickness, 2 μm) to form a block copolymer layer having a thickness of 10 nm. The formed block copolymer layer was put in a solvent vapor atmosphere of carbon disulfide for 20 hours for micro-phase separation. The structure of the micro-phase separated block copolymer layer was analyzed and evaluated through AFM. FIG. 4 is an AFM photograph (measurement range, 1000 nm×1000 nm) after micro-phase separation of the block copolymer layer obtained in Example 1 of the present invention.

Figure 5:
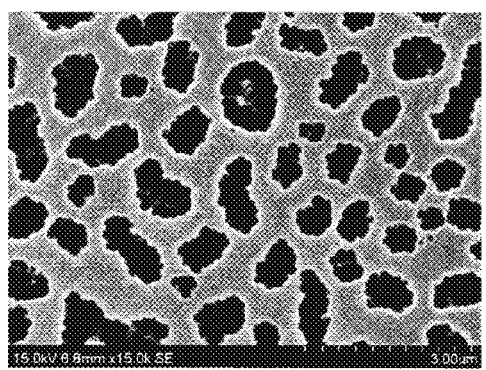
FIG. 5 This shows SEM photographs (measurement magnification, 15000 times) of the porous substrate having microscopic pores obtained in Example 1 of the present invention, in which (a) is a photograph of the surface of the porous substrate, and (b) is a photograph of the porous substrate taken from the oblique upward direction.
Figure 5:
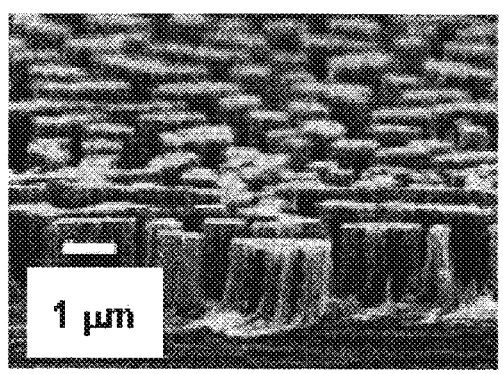

Subsequently, using a reactive ion-etching apparatus (manufactured by Samco Inc., UV-Ozone Dry Stripper), the block copolymer layer and the polyimide resin substrate were etched with oxygen plasma at a power of 50 W, a vacuum pressure of 5 Pa and an oxygen flow rate of 10 ccm for 15 minutes to produce a porous substrate, and the substrate was evaluated through SEM observation. FIG. 5 shows SEM photographs (measurement magnification, 15000 times) of the porous substrate having microscopic pores obtained in Example 1 of the present invention, in which (a) is a photograph of the surface of the porous substrate, and (b) is a photograph of the porous substrate taken from the oblique upward direction.

(2) Film Formation of Thermoelectric Semiconductor Layer

Using the porous substrate formed in the above (1), a film of a p-type bismuth telluride of a thermoelectric conversion material was formed on the substrate according to an arc plasma vapor-deposition method to form a thermoelectric semiconductor layer thereon.

First, starting material particles of a thermoelectric conversion material containing two or more elements, a p-type bismuth telluride ($Bi_{0.4}Te_{3.0}Sb_{1.6}$; elemental composition, Bi/Te/Sb=9/60/31) were put in a stainless mold, kept therein at a sintering temperature of 200° C. for 1 hour according to a hot pressing method, thereby producing a columnar cathode electrode (vapor-deposition source; target) (φ10×17 mm) of the thermoelectric semiconductor material to be the coaxial vacuum arc plasma vapor-deposition source to be mentioned below.

Next, using the coaxial vacuum arc plasma vapor-deposition apparatus of FIGS. 3(a) and (b), and at a time when the degree of vacuum inside the chamber reached $5.0 \times 10^{-3}$ Pa or less, a thin film (1.5 μm) of the p-type bismuth telluride was formed on the porous substrate through 3000 times discharge at an arc voltage of 80 V and a film formation rate of 5 Å/time (one discharge per second). The porous substrate in the chamber was not heated and the vapor deposition thereon was carried out at room temperature.

Subsequently, this was heated at a heating rate of 5 K/min, and kept in a hydrogen/argon mixed gas (hydrogen/argon=5/95) atmosphere at an annealing temperature of 250° C. for 1 hour for annealing treatment, thereby producing a thermoelectric conversion material through crystal growth of the thermoelectric semiconductor layer therein.

Figure 6:
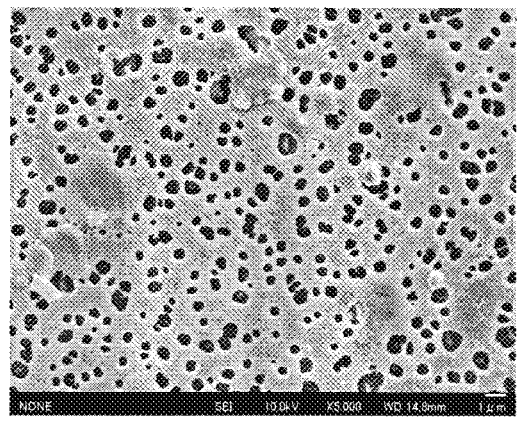
FIG. 6 This is a SEM photograph (measurement magnification, 5000 times) showing the plane of the thermoelectric conversion material obtained in Example 1 of the present invention.

FIG. 6 is a SEM photograph (measurement magnification, 5000 times) showing the plane of the thermoelectric conversion material obtained in Example 1 of the present invention. It is known that the porous substrate having a p-type bismuth telluride film formed thereon has microscopic pores.

The depth (H1) and the mean diameter (D1) of the microscopic pores were calculated, and the ratio of the depth (H1) to the mean diameter (D1) (H1/D1) was calculated. The calculated results are shown in Table 1 along with the thermoelectric performance evaluation results shown therein.

Example 2

A thermoelectric conversion material was produced under the same condition as in Example 1, except that the thermoelectric semiconductor material was changed to an n-type bismuth telluride ($Bi_{2.0}Te_{2.7}Se_{0.3}$; elemental composition, Bi/Te/Se=40/54/6) and the formed thin film was annealed at 300° C. The thermoelectric performance evaluation results of the formed material are shown in Table 1.

Example 3

A thermoelectric conversion material was produced under the same condition as in Example 1, except that the thermoelectric semiconductor material was changed to a p-type $Mn_2Si$.

The thermoelectric performance evaluation results are shown in Table 1.

Example 4

A thermoelectric conversion material was produced under the same condition as in Example 1, except that the thermoelectric semiconductor material was changed to an n-type $Mn_2Si$.

The thermoelectric performance evaluation results are shown in Table 1.

Comparative Examples 1 and 2

Thermoelectric conversion materials were produced in the same manner as in Examples 1 and 2, except that the micro-phase separation treatment and the oxygen plasma treatment for the block copolymer layer were omitted.

The thermoelectric performance evaluation results are shown in Table 1.

Comparative Examples 3 and 4

Thermoelectric conversion materials were produced in the same manner as in Examples 3 and 4, except that the micro-phase separation treatment and the oxygen plasma treatment for the block copolymer layer were omitted.

The thermoelectric performance evaluation results are shown in Table 1.

Comparative Example 5

A thermoelectric conversion material was produced in the same manner as in Example 1, except that, in Example 1, the oxygen plasma etching was carried out at a power of 50 W, a degree of vacuum of 5 Pa and an oxygen flow rate of 10 ccm for 3 seconds to form the porous substrate. The thermoelectric performance evaluation results are shown in Table 1.

plastic film, no microscopic pores were formed, and the Non-dimensional figure of merit ZT of the former was extremely high. This can be understood by comparing Examples and Comparative Examples both using the same thermoelectric semiconductor material. For the thermoelectric conversion material of Comparative Example 5, the oxygen plasma etching time was short, and therefore, the ratio of the depth (H1) to the mean diameter (D1) (H1/D1) in the material was small, or that is, in the plastic film used therein, no microscopic pores were formed, and consequently, the Non-dimensional figure of merit ZT of the material was lower than that of the material of Example 1.

Example 5

Production of Thermoelectric Conversion Module and Evaluation of the Output Power Characteristics Thereof As shown in FIG. 7, using the porous substrate produced in Example 1, ten thermoelectric semiconductor layers 42 (1 mm×30 mm, film thickness 1.5 μm) each formed of a thermoelectric conversion material of a p-type bismuth telluride and ten thermoelectric semiconductor layers 43 (1 mm×30 mm, film thickness 1.5 μm) each formed of a thermoelectric conversion material of an n-type bismuth telluride and were alternately arranged on the substrate according to an arc plasma vapor-deposition method, at a regular pitch (0.4 cm).

TABLE 1

| | | Example 1 | Example 2 | Example 3 | Example 4 | Comparative Example 1 |
|---|---|---|---|---|---|---|
| Solvent Annealing: under carbon disulfide solvent vapor (hr) | | 20 | 20 | 20 | 20 | |
| Oxygen Plasma Etching Time (min) | | 15 | 15 | 15 | 15 | |
| Thickness of Thermoelectric Semiconductor Layer (μm) | p-type bismuth telluride | 1.5 | | | | 1.5 |
| | n-type bismuth telluride | | 1.5 | | | |
| | p-type Mn$_2$Si | | | 1.5 | | |
| | n-type Mn$_2$Si | | | | 1.5 | |
| Ratio of Depth (H1) to Mean Diameter (D1) of Microscopic Pores (H1/D1) | | 3 | 3 | 3 | 3 | — |
| Thermal Conductivity | λ (W/m · K) | 0.26 | 0.18 | 1.5 | 2 | 1.1 |
| Electrical Conductivity | σ (S/cm) | 180 | 220 | 500 | 300 | 360 |
| Seebeck Coefficient | S (μV/K) | 255 | −220 | 120 | −200 | 250 |
| Figure of merit | Z = σS$^2$/λ(K$^{-1}$) | 4.5 × 10$^{-3}$ | 5.92 × 10$^{-3}$ | 0.48 × 10$^{-3}$ | 0.6 × 10$^{-3}$ | 2.1 × 10$^{-3}$ |
| Non-Dimensional figure of merit | ZT (T: 300 K) | 1.35 | 1.77 | 0.14 | 0.18 | 0.6 |

| | | Comparative Example 2 | Comparative Example 3 | Comparative Example 4 | Comparative Example 5 |
|---|---|---|---|---|---|
| Solvent Annealing: under carbon disulfide solvent vapor (hr) | | | | | 20 |
| Oxygen Plasma Etching Time (min) | | | | | 0.05 |
| Thickness of Thermoelectric Semiconductor Layer (μm) | p-type bismuth telluride | | | | 1.5 |
| | n-type bismuth telluride | 1.5 | | | |
| | p-type Mn$_2$Si | | 1.5 | | |
| | n-type Mn$_2$Si | | | 1.5 | |
| Ratio of Depth (H1) to Mean Diameter (D1) of Microscopic Pores (H1/D1) | | — | — | — | 0.006 |
| Thermal Conductivity | λ (W/m · K) | 1.2 | 6 | 8 | 1.1 |
| Electrical Conductivity | σ (S/cm) | 450 | 1200 | 650 | 360 |
| Seebeck Coefficient | S (μV/K) | −220 | 120 | −200 | 248 |
| Figure of merit | Z = σS$^2$/λ(K$^{-1}$) | 1.8 × 10$^{-3}$ | 0.29 × 10$^{-3}$ | 0.33 × 10$^{-3}$ | 2.0 × 10$^{-3}$ |
| Non-Dimensional figure of merit | ZT (T: 300 K) | 0.54 | 0.09 | 0.1 | 0.6 |

Of the thermoelectric conversion materials of Examples 1 to 4, the thermal conductivity was greatly lowered, as compared with that of the thermoelectric conversion materials of Comparative Examples 1 to 4, in which the plastic film used were not processed for micro-phase separation treatment and oxygen plasma treatment and therefore in the At the bonding part and the thermoelectromotive force-taking out part of the thermoelectric semiconductor layers 42 and 43, formed were copper films each having a thickness of 500 nm according to a vapor-deposition method, as a bonding electrode 44 (3.5 mm×5 mm) and as a thermoelectromotive force-taking out electrode 45 (3 mm×12 mm), respectively, thereby constructing the thermoelectric conversion module 41.

Next, at room temperature, one end of the thermoelectric conversion module was stepwise heated on a hot plate from room temperature to 150° C. thereby giving a temperature difference to the module to measure the thermoelectromotive force V (V) and the electric resistance R (Ω) thereof. The output power P (W) of the module was calculated from the thermoelectromotive force V and the electric resistance R measured as above, according to $P=V^2/R$.

Example 6

A thermoelectric semiconductor module was produced in the same manner as in Example 5, except that the thermoelectric conversion material, p-type bismuth telluride was changed to a p-type $Mn_2Si$ and the n-type bismuth telluride to an n-type $Mn_2Si$.

Comparative Example 6

A thermoelectric semiconductor module was produced by forming the thermoelectric semiconductor layer of a film of the thermoelectric conversion material, p-type bismuth telluride and forming the thermoelectric semiconductor layer of a film of the thermoelectric conversion material, n-type bismuth telluride, in the same manner as in Example 5 except that the block copolymer layer used therein was not processed for micro-phase separation treatment and for oxygen plasma treatment.

Comparative Example 7

A thermoelectric semiconductor module was produced by forming the thermoelectric semiconductor layer of a film of the thermoelectric conversion material, p-type $Mn_2Si$ and forming the thermoelectric semiconductor layer of a film of the thermoelectric conversion material, n-type $Mn_2Si$, in the same manner as in Example 6 except that the block copolymer layer used therein was not processed for micro-phase separation treatment and for oxygen plasma treatment.

Figure 8:
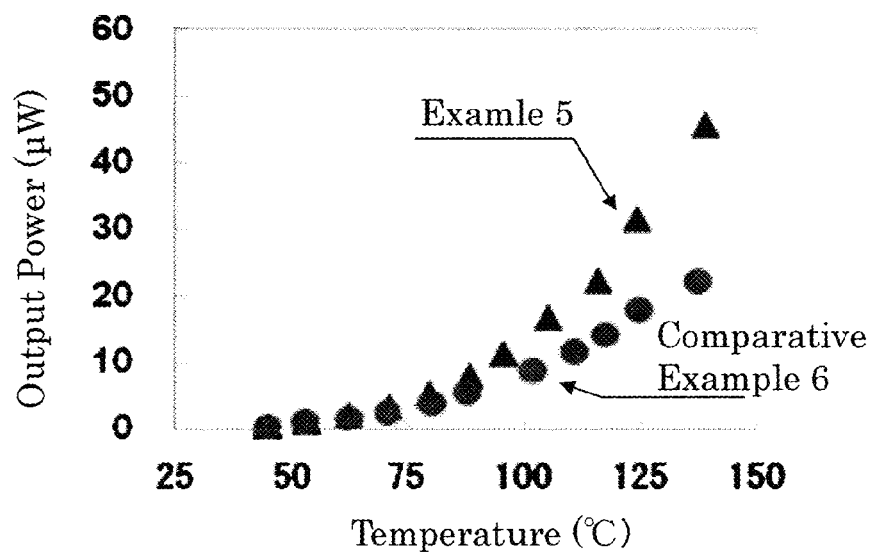
FIG. 8 This is a graph showing the relationship of the output power relative to the high-temperature side temperature of the thermoelectric conversion modules obtained in Example 5 of the present invention and Comparative Example 6.
Figure 9:
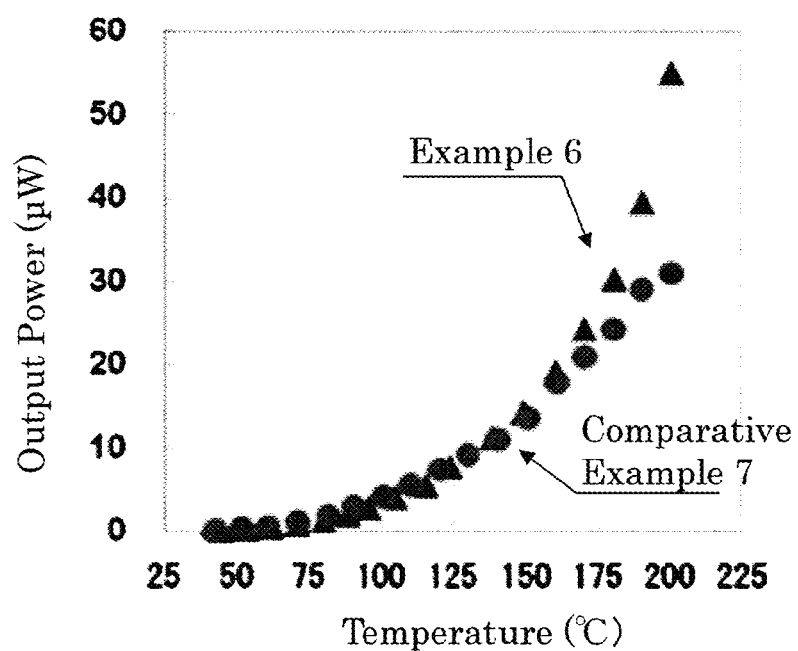
FIG. 9 This is a graph showing the relationship of the output power relative to the high-temperature side temperature of the thermoelectric conversion modules obtained in Example 6 of the present invention and Comparative Example 7.

FIG. 8 shows the relationship of the output power relative to the heating temperature in Example 5 and Comparative Example 6, and FIG. 9 shows the relationship of the output power relative to the heating temperature in Example 6 and Comparative Example 7. Table 2 shows the output power at the heating temperature of 70° C. or 140° C. in Example 5 and Comparative Example 6, and the output power at the heating temperature of 100° C. or 200° C. in Example 6 and Comparative Example 7.

TABLE 2

|  |  | Example 5 | Example 6 | Comparative Example 6 | Comparative Example 7 |
|---|---|---|---|---|---|
| Thickness of Thermoelectric Semiconductor Layer (μm) | p-type bismuth telluride | 1.5 |  | 1.5 |  |
|  | n-type bismuth telluride | 1.5 |  | 1.5 |  |
|  | p-type $Mn_2Si$ |  | 1.5 |  | 1.5 |
|  | n-type $Mn_2Si$ |  | 1.5 |  | 1.5 |
| Porous Substrate (processed for micro-phase separation treatment and oxygen plasma treatment): A Non-Porous Substrate (not processed for micro-phase separation treatment and oxygen plasma treatment): B |  | A | A | B | B |
| Module Power | P (μW) (heating temperature 70° C.) | 3.4 |  | 2.5 |  |
|  | P (μW) (heating temperature 140° C.) | 45.7 |  | 22.2 |  |
|  | P (μW) (heating temperature 100° C.) |  | 4.2 |  | 4.1 |
|  | P (μW) (heating temperature 200° C.) |  | 55.1 |  | 31 |

INDUSTRIAL APPLICABILITY

The thermoelectric conversion material of the present invention is, as formed into a thermoelectric conversion element for energy interconversion between heat and electricity, incorporated in a module and is used therein. Concretely, as being a high-efficiency thermoelectric conversion material, the thermoelectric conversion material of the present invention is considered to be applicable to use for converting the exhaust heat from various combustion furnaces such as cement combustion furnaces, the combustion gas exhaust heat from automobiles, and the exhaust heat from electronic instruments into electricity.

REFERENCE SIGNS LIST

1: Thermoelectric Conversion Material
2: Plastic Film (A)
3: Polymer Layer (B)
4: Block Copolymer Layer
4A: Micro-Phase Separated Block Copolymer Layer
5: Porous Substrate
6: Microscopic Pore
7: Inner Bottom
8: Thermoelectric Semiconductor Layer
21: Porous Substrate
22: Vacuum Exhaust Port
23: Cathode Electrode (vapor-deposition source: target)
24: Trigger Electrode
25: Power-supply Unit
26: Anode Electrode
27: Trigger Power Source
28: Arc Power Source
29: Capacitor
30: Insulator
31: Arc Plasma
41: Thermoelectric Conversion Module 42: Thermoelectric Semiconductor Layer (p-type bismuth telluride)
43: Thermoelectric Semiconductor Layer (n-type bismuth telluride)
44: Bonding Electrode
45: Thermoelectromotive Force-Taking out Electrode

The invention claimed is:

1. A thermoelectric conversion material comprising, on a porous substrate comprising microscopic pores, a thermoelectric semiconductor layer formed of a thermoelectric semiconductor material, wherein the porous substrate has a polymer layer (B) on a plastic film (A) and the microscopic pores are formed in the polymer layer (B) and in a part of the plastic film (A), the thermoelectric semiconductor layer is present on top of the polymer layer (B) and on the inside bottom of the microscopic pores, and the thermoelectric semiconductor layer on the top of the polymer layer (B) is electrically insulated from the thermoelectric layer on the inside bottom of the microscopic pores.

2. The thermoelectric conversion material according to claim 1, wherein the ratio of the depth (H1) to the mean diameter (D1), (H1/D1) of the microscopic pores is from 0.5 to 20.

3. The thermoelectric conversion material according to claim 1, wherein the thickness of the thermoelectric semiconductor layer on the top of the polymer layer (B) is from 50 nm to 20 μm and the thickness of the thermoelectric semiconductor layer on the inside bottom of the microscopic pores is from 25 nm to 1.5 μm.

4. The thermoelectric conversion material according to claim 1, wherein the polymer layer (B) is formed of a polymer that comprises a polyhedral oligomeric silsesquioxane-containing polymethacrylate.

5. The thermoelectric conversion material according to claim 4, wherein the thickness of the polymer layer (B) is from 1 to 100 nm.

6. The thermoelectric conversion material according to claim 1, wherein the plastic film (A) is formed of a polyimide, a polyethylene terephthalate or a polycarbonate.

7. The thermoelectric conversion material according to claim 6, wherein the thickness of the plastic film (A) is from 1 to 100 μM.

8. The thermoelectric conversion material according to claim 1, wherein the thermoelectric semiconductor material is at least one of a bismuth-tellurium-based thermoelectric semiconductor material and a silicide-based thermoelectric semiconductor material.

9. A thermoelectric conversion module comprising the thermoelectric conversion material according to claim 1.

10. The thermoelectric conversion material according to claim 1, wherein the microscopic pores have a depth of from 50 nm to 40 μm, a mean diameter of 50 nm to 30 μm, and a mean center-to-center distance between adjacent pores is 15 to 1500 nm.

* * * * *